United States Patent
Wang et al.

(10) Patent No.: US 11,289,843 B2
(45) Date of Patent: Mar. 29, 2022

(54) TEST ADAPTER

(71) Applicant: Samsung Electronics Co., Ltd., Gyeonggi-do (KR)

(72) Inventors: Yumei Wang, Shenzhen (CN); Fei Gao, Shenzhen (CN); Yuanwei Wang, Shenzhen (CN); Futing Lv, Shenzhen (CN)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/938,223

(22) Filed: Jul. 24, 2020

(65) Prior Publication Data

US 2021/0305743 A1 Sep. 30, 2021

(30) Foreign Application Priority Data

Mar. 31, 2020 (CN) .......................... 202010242654.0

(51) Int. Cl.
*H01R 9/05* (2006.01)
*H01R 13/24* (2006.01)
(Continued)

(52) U.S. Cl.
CPC ..... *H01R 13/2407* (2013.01); *G01R 1/07328* (2013.01); *H01R 12/7082* (2013.01);
(Continued)

(58) Field of Classification Search
CPC .............. H01R 13/2407; H01R 12/714; H01R 12/7082; H01R 13/405; H01R 12/7047; H01R 2201/20; G01R 1/07328
(Continued)

(56) References Cited

U.S. PATENT DOCUMENTS 3,622,939 A * 11/1971 Forney, Jr. ........... H01R 9/0521
439/322
4,936,800 A * 6/1990 Couper ................ G01R 1/0416
439/863
(Continued)

FOREIGN PATENT DOCUMENTS

CN        107121608        9/2017
CN        110618372        12/2019
(Continued)

OTHER PUBLICATIONS

International Search Report dated Dec. 24, 2020 issued in counterpart application No. PCT/KR2020/009848, 8 pages.

*Primary Examiner* — Abdullah A Riyami
*Assistant Examiner* — Nelson R. Burgos-Guntin
(74) *Attorney, Agent, or Firm* — The Farrell Law Firm, P.C.

(57) ABSTRACT

A test adapter for establishing a test connection with a circuit board is provided. The circuit board includes an inter-board connector or a planar contact in close contact with the inter-board connector. The test adapter includes a metal housing having a contact surface in contact with a flat surface of the circuit board, a connection end opposite to the contact surface, and a first cavity having a first opening at the center of the contact surface. The test adapter further comprises a first outer conductor and a first inner conductor arranged in the first cavity, and an insulating medium arranged between the first outer conductor and the first inner conductor. An end of the first outer conductor and an end of the first inner conductor protrude out of the housing via the first opening, the first outer conductor and the first inner conductor both have an elastic deformation capacity along an axial direction to enable the end of the first outer conductor and the end of the first inner conductor both to retract inwards to be in close contact with the planar contact (Continued)

to form a signal-conductive connection between the planar contact and the connection end when the contact surface is in contact with the circuit board.

7 Claims, 11 Drawing Sheets

(51) Int. Cl.
 *G01R 1/073* (2006.01)
 *H01R 12/70* (2011.01)
 *H01R 12/71* (2011.01)
 *H01R 13/405* (2006.01)

(52) U.S. Cl.
 CPC ......... *H01R 12/714* (2013.01); *H01R 13/405* (2013.01); *H01R 12/7047* (2013.01); *H01R 2201/20* (2013.01)

(58) Field of Classification Search
 USPC .......................................................... 439/55
 See application file for complete search history.

(56) References Cited

U.S. PATENT DOCUMENTS

| | | | | |
|---|---|---|---|---|
| 4,995,837 | A * | 2/1991 | Couper | G01R 1/0416 439/863 |
| 5,659,889 | A * | 8/1997 | Cockson | H04B 1/38 455/575.7 |
| 5,857,861 | A * | 1/1999 | Silliman | H01R 24/46 439/171 |
| 5,936,421 | A * | 8/1999 | Stowers | G01R 15/12 324/750.27 |
| 5,942,906 | A * | 8/1999 | Stowers | G01R 1/07371 324/750.25 |
| 6,407,562 | B1 * | 6/2002 | Whiteman | G01R 1/06766 324/754.07 |
| 6,488,545 | B1 * | 12/2002 | Meyer | H01R 24/547 439/248 |
| 7,221,245 | B2 * | 5/2007 | Tanbakuchi | H01P 1/045 174/88 C |
| 7,375,533 | B2 * | 5/2008 | Gale | H01R 31/06 324/538 |
| 8,044,673 | B1 * | 10/2011 | Burgyan | G01R 1/0466 324/750.16 |
| 8,814,601 | B1 * | 8/2014 | Sherrer | H01R 24/50 439/625 |
| 2006/0284638 | A1 * | 12/2006 | Gale | H01R 31/06 324/537 |
| 2015/0130491 | A1 * | 5/2015 | Kretz | G01R 3/00 324/755.02 |
| 2015/0300902 | A1 * | 10/2015 | Rabe | G01D 11/245 73/53.01 |
| 2020/0021049 | A1 * | 1/2020 | Song | H01R 12/7082 |
| 2021/0050680 | A1 * | 2/2021 | Zhu | H01R 24/54 |

FOREIGN PATENT DOCUMENTS

| | | |
|---|---|---|
| JP | 2015-162397 | 9/2015 |
| KR | 10-1974785 | 5/2019 |

* cited by examiner

TEST ADAPTER

CROSS-REFERENCE TO RELATED APPLICATION(S)

This application is based on and claims priority under 35 U.S.C. § 119 to Chinese Patent Application No. 202010242654.0, filed on Mar. 31, 2020, in the China National Intellectual Property Administration, the disclosure of which is incorporated by reference herein in its entirety.

BACKGROUND

1. Field

The present disclosure relates generally to radio frequency (RF) equipment of wireless base stations.

2. Description of Related Art

Conventional wireless base station RF interconnection schemes generally utilize an RF (coaxial) connector for board interconnections. The coaxial connector is composed of a male connector and a female connector coupled with each other. Such schemes making interconnections between the boards inevitably have the following disadvantages: there is a restriction of spatial height such that the spacing between the boards cannot be greater than 10 mm; the distance between two adjacent channels is large, which is not structurally compact; the large number of parts requires relatively complex welding and assembly procedures; and the large number of test adapters makes assembly and disassembly processes complicated.

SUMMARY

The present disclosure has been made to address the above-mentioned problems and disadvantages, and to provide at least the advantages described below.

In accordance with an aspect of the present disclosure, a test adapter for establishing a test connection with a circuit board is provided. The circuit board includes an inter-board connector or a planar contact in close contact with the inter-board connector. The test adapter includes a metal housing having a contact surface in contact with a flat surface of the circuit board, a connection end opposite to the contact surface, and a first cavity having a first opening at the center of the contact surface. The test adapter further comprises a first outer conductor and a first inner conductor arranged in the first cavity, and an insulating medium arranged between the first outer conductor and the first inner conductor. An end of the first outer conductor and an end of the first inner conductor protrude out of the housing via the first opening, the first outer conductor and the first inner conductor both have an elastic deformation capacity along an axial direction to enable the end of the first outer conductor and the end of the first inner conductor both to retract inwards to be in close contact with the planar contact to form a signal-conductive connection between the planar contact and the connection end when the contact surface is in contact with the circuit board.

In accordance with another aspect of the present disclosure, a test adapter for establishing a test connection with a circuit board is provided. The circuit board includes a floating inter-board connector or a planar contact in contact with the floating inter-board connector. The test adapter includes a metal housing having a contact surface in contact with a flat surface of the circuit board, a connection end opposite to the contact surface, and a second cavity having a second opening at the center of the contact surface. The test adapter further comprises a second inner conductor arranged in the second cavity and an insulating medium arranged between the second inner conductor and the second cavity. An end of the second inner conductor is flush with the contact surface, and the inter-board connector has an elastic deformation capacity along an axial direction to enable the end of the second inner conductor and the contact surface to be both in close contact with the floating inter-board connector to form a signal-conductive connection between the floating inter-board connector and the connection end when the contact surface is in contact with the circuit board.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1A:
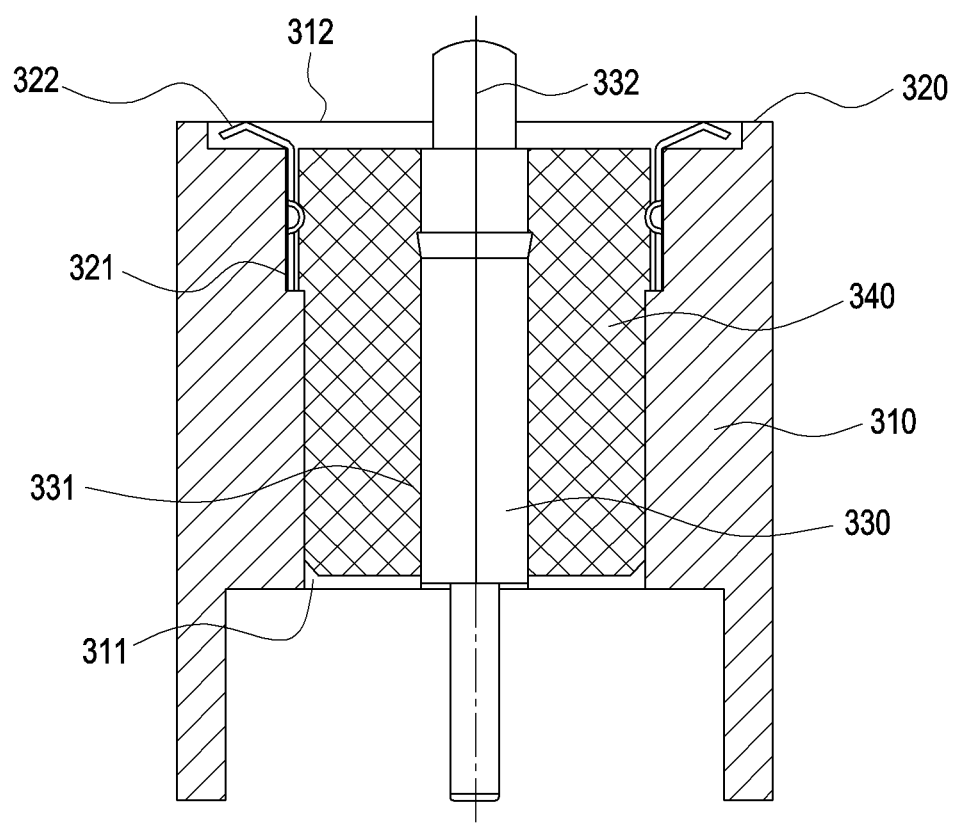
FIG. 1A is a schematic diagram illustrating the structure of a one-piece floating inter-board connector, according to an embodiment.

Various embodiments of the present disclosure are described with reference to the accompanying drawings. However, various embodiments of the present disclosure are not limited to particular embodiments, and it should be understood that modifications, equivalents, and/or alternatives of the embodiments described herein can be variously made. With regard to description of drawings, similar components may be marked by similar reference numerals.

Herein, "schematically" means "serving as an example, instance, or illustration", and any illustrations or embodiments described herein as "schematically" should not be interpreted as a more preferred or more advantageous technical solution.

In order to make the drawings concise, the drawings only show parts that are relevant to the present disclosure, and the drawings do not represent the actual structure of the product. In addition, in order to make the drawings concise and readily understood, in some drawings, only one of components having the same structure or function is schematically shown or labeled.

In order to address the large amount of inter-board spacing and the large number of excessive parts in conventional inter-board interconnection schemes using plug-in coaxial connectors as inter-board connectors, embodiments of the present disclosure provide an inter-board interconnection scheme using a one-piece floating connector as the inter-board connector.

An aspect of the present disclosure is to provide a test adapter for establishing a test connection with a circuit board having a floating inter-board connector. The test adapter is in close contact with a floating inter-board connector or a planar contact to realize blind joining for a single circuit board.

Figure 2A:
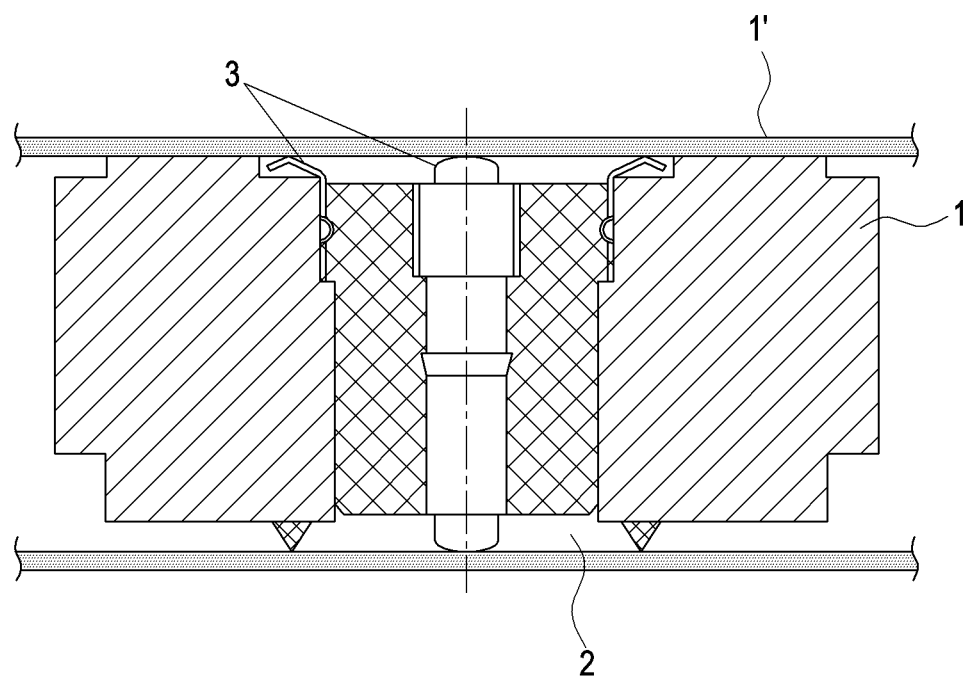
FIG. 2A is a schematic diagram illustrating the structure of an inter-board interconnection scheme with a floating inter-board connector, according to an embodiment.

As shown in FIG. 1A and FIG. 2A, a one-piece floating connector 2 for connecting circuit boards 1 and 1' is provided. The floating connector 2 is fixed on the circuit board 1, and a planar contact 3 is provided at a position corresponding to the floating connector 2 on the circuit board 1', so that the floating connector 2 is in close contact with the planar contact 3 to form the electrical connection and signal connection of the circuit boards 1 and 1'.

In an embodiment, the floating connector 2 includes a housing 310, made of metal, having a cavity 311, the cavity 311 has an opening 312 at an end surface of the housing 310. The floating connector further includes an outer conductor 320 and an inner conductor 330, arranged in the cavity 311, an insulator 340 arranged between the outer conductor 320 and the inner conductor 330, the outer conductor 320 is electrically connected to the housing 310. An end of the outer conductor 320 and an end of the inner conductor 330 extend out of the housing 310 via the opening 312, the outer conductor 320 and the inner conductor 330 both have an elastic deformation capacity along an axial direction. When the circuit board 1' is in contact with the housing 310 from the end having the opening 312, the end of the outer conductor 320 and the end of the inner conductor 330 are both in close contact with corresponding planar contacts 3 on the circuit board 1'.

The end of the outer conductor 320 and the end of the inner conductor 330 may protrude out of the housing 310 via the opening 312. The elastic deformation capacity of the outer conductor 320 and the inner conductor 330 in the axial direction may be greater than or equal to the length of the ends of the outer conductor 320 and the inner conductor 330 out of the housing 310.

The floating connector 2 can be press-fitted or soldered to the circuit board 1 to serve as an RF input port or an RF output port of the circuit board 1. The circuit boards 1 and 1' may be, for example, metal filters, dielectric filters, or antenna boards.

The circuit boards 1 and 1' may be connected by simply aligning and fitting the floating connector 2 with the planar contact 3 to complete the docking of the connectors. Fixing the relative position of the circuit boards 1 and 1' can fix the connection position between the floating connector 2 and the planar contact 3. When in contact with the housing 310 of the floating connector 2, the outer conductor 320 and the inner conductor 330 may be pressed by the circuit board 1' to generate elastic deformations in the axial direction to be in close contact with the planar contact 3 on the circuit board 1'.

The outer conductor 320 may include a tube wall 321 being a circular tube in contact with the inner wall of the cavity 311 to be electrically connected to the housing 310; and a reed 322 extending along a radial direction out of the tube wall 321 via an end facing the opening 312, the reed 322 forms an angle with the tube wall 321, and an end of the reed 322 forms an electric-conductive connection with the planar contact 3.

When receiving an external force in the axial direction, the reed 322 may move in the direction which makes the angle smaller to generate an elastic deformation in the axial direction.

Figure 1B:
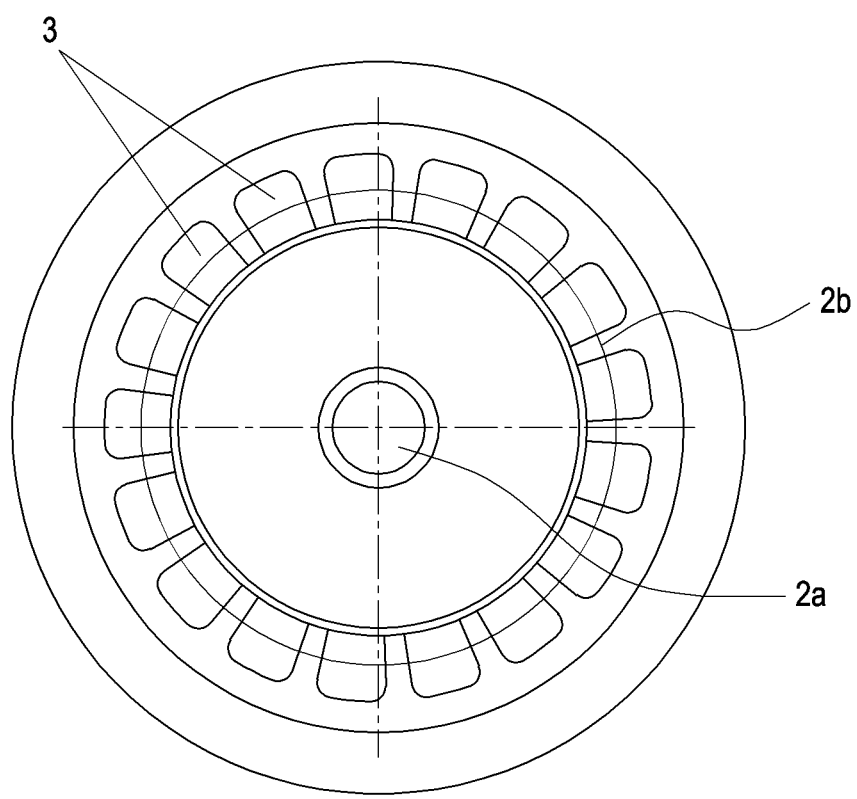
FIG. 1B is a schematic diagram illustrating the structure of a one-piece floating inter-board connector according to an embodiment.

The reed 322 may have a one-piece ring structure, or may be a plurality of reeds uniformly arranged at the end of the tube wall 321 as shown in FIG. 1B. The plurality of reeds may need a much smaller external force than the one-piece reed 322. Further, the structure of a plurality of reeds can improve the connection stability, and avoid false contact between the plurality of reeds and the planar contact 3.

As shown in FIG. 1A, the inner conductor 330 may have a floating probe structure, and may include an inner conductor housing 331 arranged in the insulator 340 along the axial direction to be insulated from the outer conductor 320. The inner conductor 330 may further include an elastic contact 332 arranged in the inner conductor housing 331 on an end facing the opening 312. The elastic contact 332 may be capable of elastically expanding and contracting along the inner conductor housing 331. When the elastic element is in a natural state, the end of the elastic contact 332 may extend out of the housing 310 from the opening 312. The elastic contact 332 may retract within the housing 310 when an external force is applied, and may protrude out of the housing 310 after the external force is withdrawn.

Therefore, the floating inter-board connector of may have an elastic deformation capacity along the axial direction to enable elastic contact with the planar contact, thereby allowing the one-piece structure to be matched with the planar contact without requiring a two-piece structure using plug-in connectors, which reduces the volume of space occupied by the inter-board connectors to achieve interconnection by blindly joining connectors with ultra-small board spacing. Further, with reduced number of components of the connectors, the number of assembly procedures can be reduced which facilitates automated assembly production.

Figure 2B:
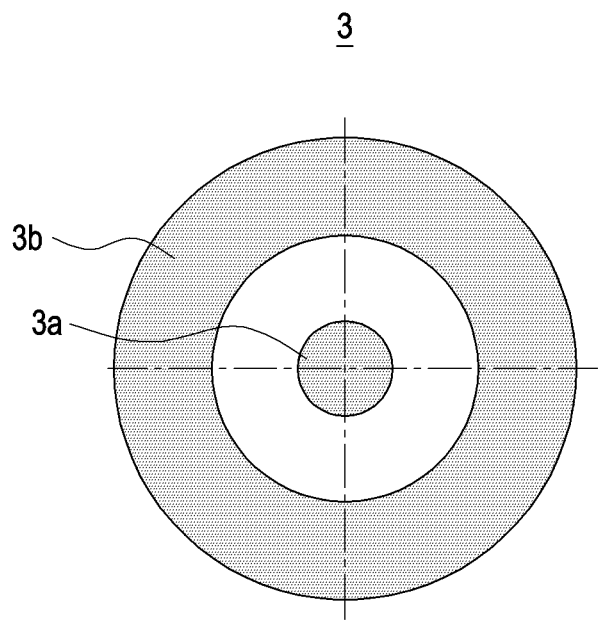
FIG. 2B is a schematic diagram illustrating the structure of an inter-board interconnection scheme with a floating inter-board connector, according to an embodiment.

As shown in FIG. 1B and FIG. 2B, the floating inter-board connector 2 includes a center contact 2a formed by an end of the inner conductor 330, and a ring-shaped contact 2b formed by the reed 322. As shown in FIGS. 1B and 2B, the ring-shaped contact 2b may be arranged to surround the center contact 2a concentrically with the center contact 2a, and may be insulated from the center contact 2a by the insulator 340.

The planar contact 3 may also include a center contact 3a at the center of the planar contact 3 to correspond to the center contact 2a. The planar contact 3 may also include a ring-shaped contact 3b surrounding the center contact 3a concentrically with the center contact 3a. The ring-shaped contact 3b may be insulated from the center contact 3a by an insulating material.

The ring-shaped contacts 2b and 3b may be arranged at corresponding positions, and the ring-shaped contact 3b may have a width greater than the width of the ring-shaped contact 2b to ensure a stable connection between the ring contacts 2b and 3b when elastic deformation occurs. The center contacts 2a and 3a may be arranged at corresponding positions, and the center contact 3a may have a diameter larger than the diameter of the center contact 3b to avoid misalignment of the contacts.

The center contacts 3a and 2a can be used for RF signal connections, and the ring-shaped contacts 3b and 2b may be used for electrical connections.

For the circuit board interconnection scheme using the floating inter-board connector of the present disclosure, a test adapter for establishing a test connection with a circuit board having a floating inter-board connector may be provided. The test adapter may be in close contact with a floating inter-board connector or a planar contact, and may convert a signal outputted from the floating inter-board connector or the planar contact into a signal outputted from a general interface, so as to realize a blind joining test of a single circuit board.

Figure 3A:
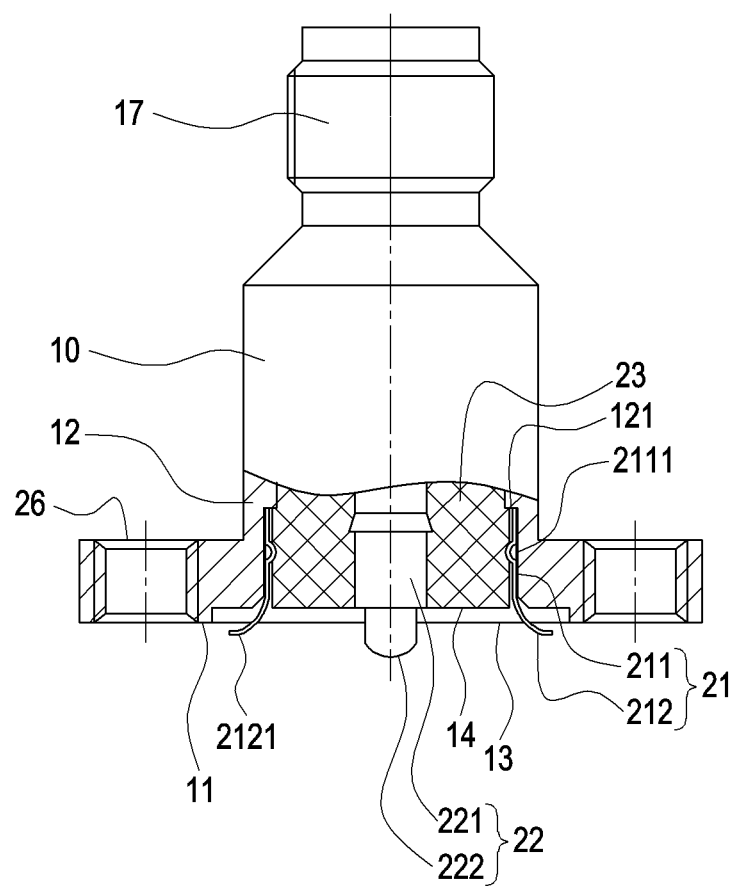
FIG. 3A is a schematic diagram illustrating the structure of a test adapter, according to an embodiment.
Figure 3B:
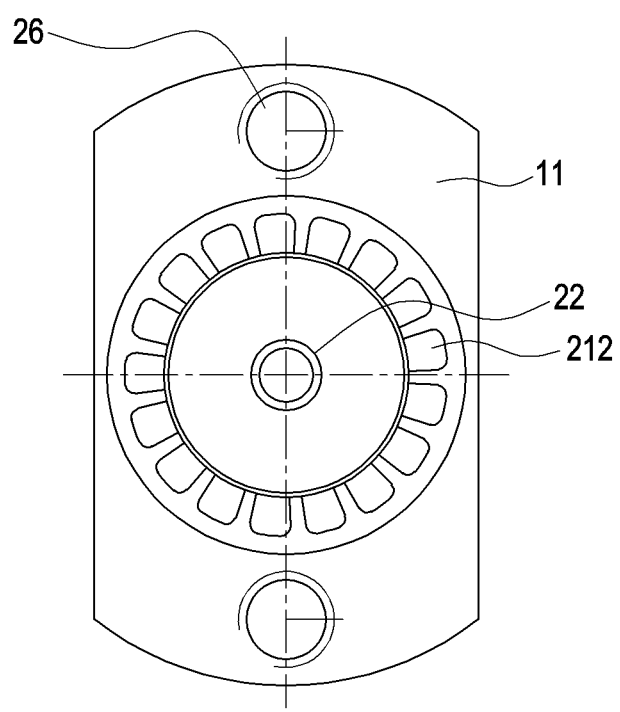
FIG. 3B is a bottom view of the test adapter of FIG. 3A, according to an embodiment.
Figure 4:
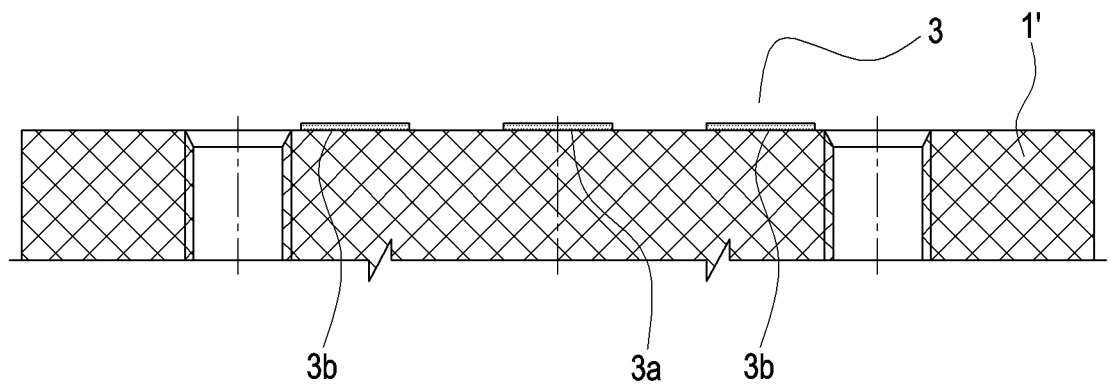
FIG. 4 is a schematic diagram illustrating part of a circuit board, according to an embodiment.
Figure 5:
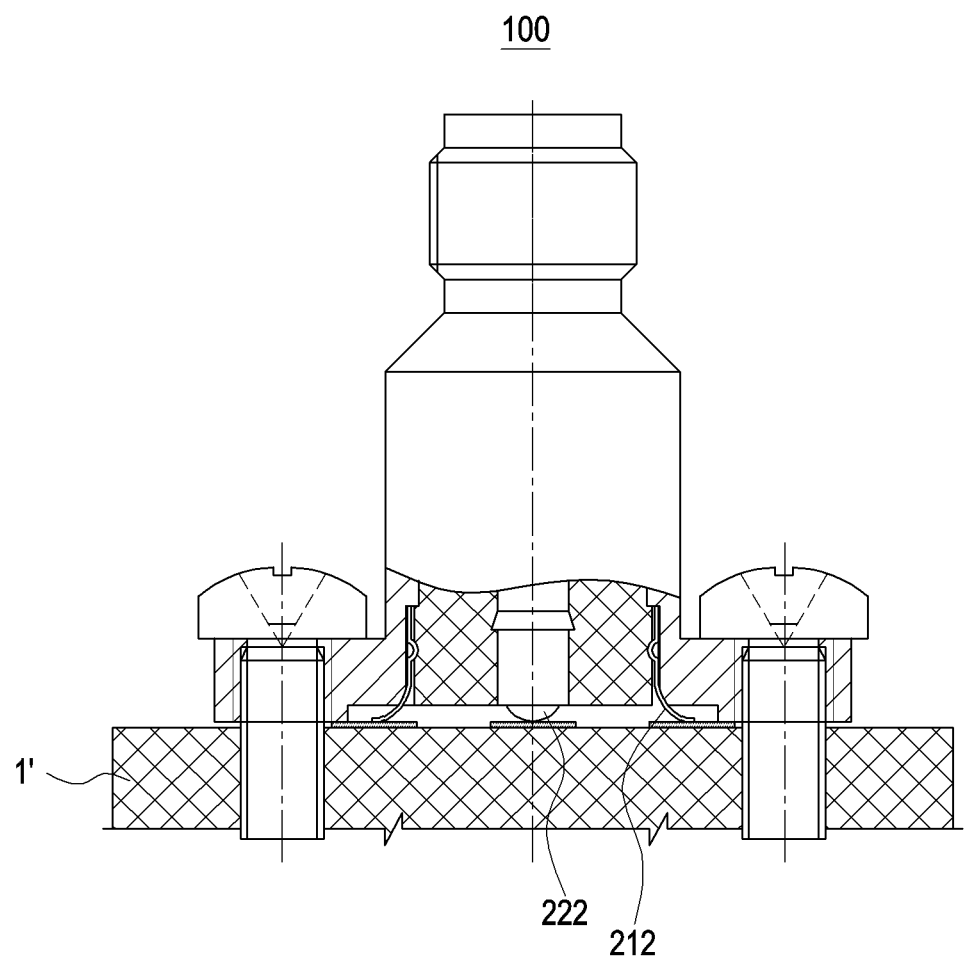
FIG. 5 is a schematic diagram illustrating a state of the test adapter of FIG. 3A as being in use, according to an embodiment.

FIG. 3A is a schematic diagram illustrating the structure of a test adapter, according to an embodiment. FIG. 3B is a bottom view of the test adapter of FIG. 3A, according to an embodiment. FIG. 4 is a schematic diagram of part of the circuit board 1', according to an embodiment. FIG. 5 is a schematic diagram illustrating the use state of the test adapter of FIG. 3A, according to an embodiment.

As shown in FIGS. 3A and 3B, a test adapter 100 configured to have a test connection with a circuit board 1' is provided. A circuit board 1 may include an inter-board connector 2, and the circuit board 1' may include a planar contact 3 which is in close contact with the inter-board connector 2.

The test adapter 100 may include a metal housing 10. The metal housing 10 may have a contact surface 11 in contact with a flat surface of the circuit board 1, and a connection end 17 opposite to the contact surface 11. The metal housing 10 may have a first cavity 12. The first cavity 12 may have a first opening 13 at the center of the contact surface 11.

The test adapter 100 may also include a first outer conductor 21 and a first inner conductor 22 arranged in the first cavity 12, and an insulating medium 23 arranged between the first outer conductor 21 and the first inner conductor 22. The first outer conductor 21 may be in an electric-conductive connection with the metal housing 10, and the first inner conductor 22 may be a signal-conductive connection with the connection end 17.

The first outer conductor 21 and the first inner conductor 22 each has an end protruding out of the housing 10 via the first opening 13. Both the first outer conductor 21 and the first inner conductor 22 have an elastic deformation capacity along the axial direction to enable the end of the first outer conductor 21 and the end of the first inner conductor 22 to retract inwards to be in close contact with the planar contact 3 to form a signal-conductive connection between the planar contact 3 and the connecting end 17 when the contact surface 11 is attached to the circuit board 1', thereby being able to receive a signal output from the planar contact 3 and output the signal via the connection terminal 17.

It can be seen from the above technical schemes that a test adapter for a planar contact is provided. The contact surface determines the relative position of one end of the test adapter to the planar contact, and the conductors having the axial elastic deformation capacity make the connection between the test adapter and the planar contact stable. The other end of the test adapter may be configured to be a general-purpose connector, such as a small A type (SMA) connector, to output signals from the planar contact through the general-purpose connector. The test adapter of this embodiment not only has a connection structure with a floating connector matched with a planar contact, but also provides fast, accurate, and highly compatible positioning and installation, and can perform a blind joining test of a single board.

The connecting end 17 may be a female SMA connector or a female N connector.

According to FIG. 4, the planar contact 3 includes a center contact 3a arranged at the center of the planar contact 3; a ring-shaped contact 3b, arranged to surround the center contact 3a concentrically with the center contact 3a. The ring-shaped contact is insulated from the center contact 3a by an insulating material.

The first outer conductor 21 is electrically connected to the ring-shaped contact 3b, and the first inner conductor 22 is in a signal-conductive connection with the center contact 3a.

As shown in FIG. 3A, the first outer conductor 21 includes a first tube wall 211 being a circular tube arranged in contact with the inner wall of the first cavity 12 to be in an electric-conductive connection with the metal housing 10. The first outer conductor 21 further includes a first reed 212 extending out of the first tube wall 211 via an end facing the first opening 13, forming a first angle between the first reed 212 and the end of the first tube wall 211. An end of the first reed 212 is in an electric-conductive connection with the planar contact 3.

The first angle may be an obtuse angle. When receiving a pressure from the circuit board 1', the first reed 212 may move in a direction in which the first angle shrinks, thus generating an elastic deformation in the axial direction. The elastic deformation forces the first reed 212 to maintain contact with the planar contact 3, to ensure a stable electric-conductive connection between the test adapter 100 and the planar contact 3.

The first reed 212 may have a one-piece ring-shaped structure, or may be a plurality of reeds uniformly distributed at an end of the first tube wall 211 as shown in FIGS. 3A and 3B. The plurality of first reeds may be uniformly distributed like petals of a flower. Such a distributed structure may require a smaller external force to generate the elastic deformation than the one-piece ring-shaped structure, and therefore, the shape, the number, the first angle, and the material of the first reed(s) may be configured according to the contact force in the application scenario.

When the first outer conductor 21 includes a plurality of first reeds evenly spaced with each other, the first outer conductor 21 can be kept in a stable contact with the ring-shaped contact 3b in the ring direction since each first reed 212 is an individual elastic member, thereby avoiding the first outer conductor from being in a false connection with the planar contact 3 due to an incorrect match between the surface of the edge of the first outer conductor 21 and the surface of the circuit board 1'.

The first reed 212 may have a first contact end surface 2121 perpendicular to the first tube wall 211. The first contact end surface 2121 may protrude out of the metal housing 10 via the first opening 13 to be in an electric-conductive connection with the ring-shaped contact 3b.

The first opening 13 may have a diameter greater than the outer diameter of the first reed 212. The first opening 13 may also include a sink 14 recessed into the metal housing 10 to form a first step surface in the inner wall of the first cavity 12.

The first tube wall 211 may have a diameter corresponding to that of the first cavity 12, and the first opening 13 may have a diameter greater than the outer diameter of the first reed 212. Thus, the diameter of the first opening 13 may be larger than the diameter of the first cavity 12. The sink 14 may accommodate the elastically deformed first reed 212. As shown in FIG. 5, when the test adapter 100 is docked with the circuit board 1', the contact surface 11 of the test adapter 100 may be in contact with the circuit board 1', the first reed 212 may be accommodated in the sink 14, the first contact end face 2121 of the first reed 212 may be flush with the first opening 13 and in contact with the ring-shaped contact 3b of the planar contact of the circuit board 1'.

The insulating medium 23 may be recessed in the first cavity 12, and the end surface of the insulating medium 23 may be flush with the step surface of the sink 14.

In order to firmly fix the first outer conductor 21 in the first cavity 12, the first cavity 12 may also include a second step surface 121 having a reduced diameter. The second step surface 121 may support the first outer conductor 21 from the end of the first tube wall 211 that is opposite to the first opening 13.

The first tube wall 211 may also include a plurality of limiting protrusions 2111 spaced along the circumferential direction. The limiting protrusions 2111 may protrude toward the insulating medium 23 or toward the inner wall of the first cavity 12. Similarly, the insulating medium 23 or the inner wall of the first cavity 12 may have a limiting groove for receiving the limiting protrusions 2111 at positions corresponding to the limiting protrusions 2111 to limit the position of the first outer conductor 21 in the radial direction.

As shown in FIG. 3A, the first inner conductor 22 includes a first inner conductor housing 221 arranged in the insulating medium 23 along the axial direction; and a first elastic contact 222 arranged at an end of the first inner conductor housing 221 facing the first opening 13, and capable of elastically expanding and contracting along the first inner conductor housing 221.

The end surface of the first inner conductor housing 221 facing the first opening 13 is flush with the first step surface, and the elastic contact 222 extends out of the metal housing 10 via the first opening 13 to be in a signal-conductive connection with the center contact 3a.

The expansion and contraction range of the first elastic contact 222 may be at least the distance between the initial position as shown in FIG. 3A and the end surface of the first inner conductor housing 221 facing the first opening 13.

As shown in FIG. 5, when the test adapter 100 is docked with the circuit board 1', the contact surface 11 of the test adapter 100 is in contact with the circuit board 1', and the first elastic contact 222 may retreat toward the inside of the first inner conductor housing 221 while still sticking out of the end surface of the first inner conductor housing 221 that faces the first opening 13. Accordingly, only the end of the first elastic contact 222 is in contact with the center contact 3a of the planar contact 3, and the first inner conductor housing 221 is not in contact with the planar contact 3.

In order to retain the relative position of the test adapter 100 with respect to the circuit board F, the test connector 100 may also include a positioning and mounting hole 26 on the contact surface 11 outside the first cavity 12. The positioning and mounting hole 26 is for fixing and maintaining the relative position of the test adapter 100 and the circuit board 1' using fasteners, such as screws, when both the first outer conductor 21 and the first inner conductor 22 are in contact with the planar contact 3, so that the contact surface 11 is in contact with the circuit board 1', the first outer conductor 21 is in contact with the ring-shaped contact 3b, the first inner conductor is in contact with the center contact 3a, and the first outer conductor 21 and the first inner conductor 22 are kept in a state of being elastically deformed.

The first outer conductor in electrical connection with the planar contact and the first inner conductor in signal connection with the planar contact may both have elastic deformation capacities along the axial direction to implement the connectivity test for the planar contact. The test target of the test adapter of this embodiment is signal conduction from the planar contact on the test object, i.e., the circuit board 1', to the connection end of the test adapter 100. By providing a floating conductor matching with the planar contact, and a contact surface which attaches to a fixed position of the circuit board having the planar contact, the floating inter-board connector 2 matching with the planar contact can be replaced to facilitate the test operations.

A plurality of planar contacts 3 may generally be integrated in the circuit board 1', and a test toolkit may be provided. The test toolkit may integrate metal housings 10 of a plurality of test adapters 100 into one metal board or medium board to implement an integrated test for facilitating installation and disassembly.

Figure 6A:
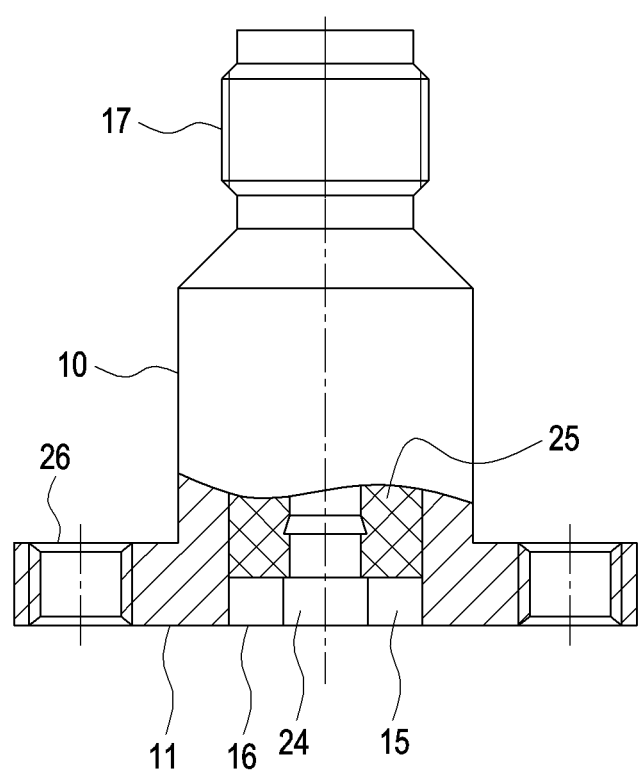
FIG. 6A is a schematic diagram illustrating the structure of a test adapter, according to an embodiment.
Figure 6B:
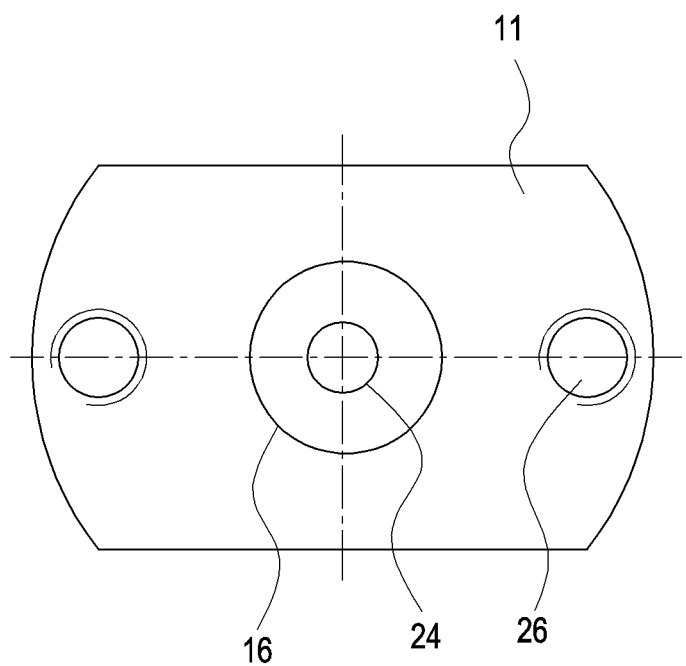
FIG. 6B is a bottom view of the test adapter of FIG. 6A, according to an embodiment.
Figure 7:
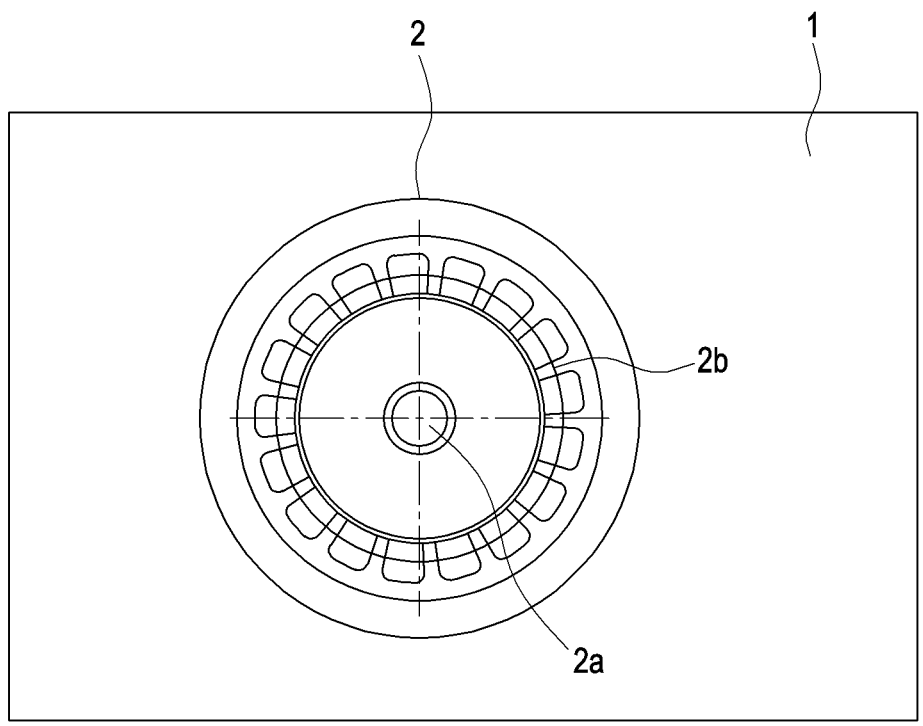
FIG. 7 is a schematic diagram illustrating part of the circuit board, according to an embodiment.
Figure 8:
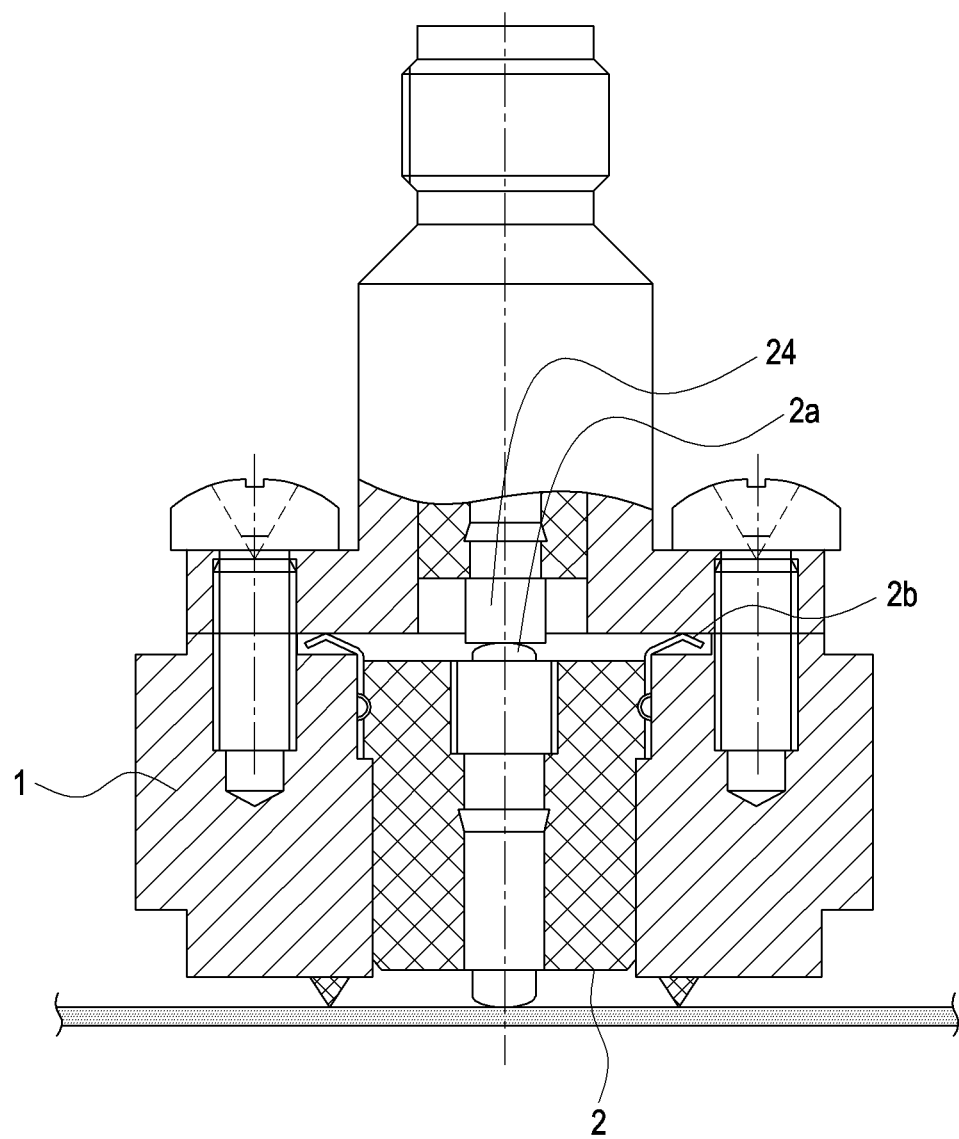
FIG. 8 is a schematic diagram illustrating a use state of the test adapter of FIG. 6A, according to an embodiment.

FIG. 6A is a schematic diagram illustrating the structure of a test adapter, according to an embodiment. FIG. 6B is a bottom view of the test adapter of FIG. 6A, according to an embodiment. FIG. 7 is a schematic diagram illustrating part of the circuit board 1, according to an embodiment. FIG. 8 is a schematic diagram illustrating the use state of the test adapter of FIG. 6A, according to an embodiment.

Referring to FIGS. 6A, 6B, 7, and 8, a test adapter 200 for establishing a test connection with a circuit board 1 having an inter-board connector 2 includes a metal housing 10 that includes a contact surface 11 in contact with a flat surface of the circuit board 1, and a connection end 17 opposite to the contact surface 11.

The metal housing 10 may also have a second cavity 15. The second cavity 15 may have a second opening 16 at the center of the contact surface 11.

The test adapter 200 may also include a second inner conductor 24 arranged in the second cavity 15 and an insulating medium 25 arranged between the second inner conductor 24 and the second cavity 15.

An end of the second inner conductor 24 is flush with the contact surface 11. The inter-board connector 2 may have an elastic deformation capacity along the axial direction. When the contact surface 11 is in contact with the circuit board 1, the end of the second inner conductor 24 and the contact surfaces 11 are both in close contact with the inter-board connector 2 to connect the inter-board connector 2 to the connection end 17, and a signal-conductive connection between the inter-board connector 2 and the connection end 17 is formed to have a signal from the inter-board connector 2 outputted via the connection end 17.

One end of the test adapter 200 may be a planar contact connected to the inter-board connector 2, and the other end may be configured to be a general-purpose connector, such as an SMA connector, to have a signal from the inter-board connector outputted via the general-purpose connector. The connecting end 17 may be a female SMA connector or a female N connector.

The second inner conductor 24 may have an elastic deformation capacity along the axial direction. When the contact surface 11 is in contact with the circuit board 1, an end of the inter-board connector 2 may extend into the second cavity 15, the second inner conductor 24 may retract under the pressure of the inter-board connector 2 to be in close contact with the inter-board connector 2.

As shown in FIG. 6B and FIG. 7, the contact points formed with the inter-board connector 2 include a center contact 2a at the center of the inter-board connector 2, and a ring-shaped contact 2b surrounding the center contact 2a concentrically with the center contact 2a, the ring-shaped contact 2b being spaced apart from the center contact 2a.

The second inner conductor 24 of the test adapter 200 may have a signal-conductive connection with the center contact 2a, and the contact surface 11 may be electrically connected to the ring-shaped contact 2b.

The second opening 16 may have the same diameter as the second cavity 15, and the second cavity 15 may accommodate the second inner conductor 24. Since the test adapter 200 provides planar contacts matching with and connectable to the floating connector while the second inner conductor 24 has a fixed position and does not generate elastic deformation, there is no need to provide a space for accommodating an elastic deformation of the second inner conductor.

Except for the signal-conductive connection between the second inner conductor 24 and the center contact 2a, no outer conductor may be configured for an electric-conductive connection with the ring-shaped contact 2b. Instead, the area outside the second opening 16 of the contact surface 11 may be used as the electric-conductive connection with the ring-shaped contact, which not only simplifies the structure of the test adapter 200, but also makes the test adapter better adapted to the dielectric filter, metal filter, antenna board, and transceiver board. Thus, the blind joining test of a one-piece test adapter and a single board can be implemented.

In order to allow spacing between the second inner conductor 24 and the contact surface 11, an end of the insulating medium 25 is recessed into the second cavity 15, and an end of the second inner conductor 24 is spaced from the inner wall of the second cavity 15.

The insulating medium 25 is recessed into the second cavity 15 to prevent the flatness of the contact surface 11 being affected by the installation error of the insulating medium 25.

In order to retain the relative position of the test adapter 200 with respect to the circuit board F, the test adapter 200 may also include a positioning and mounting hole 26 on the contact surface 11 outside the second cavity 15. The positioning and mounting hole 26 is for fixing and maintaining the relative position of the test adapter 200 and the circuit board 1 using fasteners, such as screws, when the second inner conductor 24 in contact with the inter-board connector 2, so that the contact surface 11 is in contact with the circuit board 1, the ring-shaped contact 2b of the inter-board connector 2 and the second inner conductor 24 are in contact with the center contact 2a, and the outer conductor and the inner conductor of the inter-board connector are kept in a state of being elastically deformed.

The test target of the test adapter may be signal conduction from the inter-board connector on the test object, i.e., the circuit board 1, to the connection end of the test adapter 200. By providing a planar contact matching with the floating conductor of the inter-board connector and a contact surface which attaches to a fixed position of the circuit board having the inter-board connector, the planar contact matching with the floating inter-board connector 2 can be replaced to facilitate the test operations.

A plurality of connectors 3 may be generally integrated in the circuit board 1 and also provide a test toolkit which integrates metal housings 10 of a plurality of test adapters 2 into one metal board or medium board to implement an integrated test for facilitating installation and disassembly.

The test adapters 100 and 200 can also be tested as test objects.

It can be seen from the above technical schemes that the floating inter-board connector may have an elastic deformation capacity along the axial direction to allow elastic contact with the planar contact, thereby enabling one-piece structure matching with the planar contact without requiring a two-piece structure using plug-in connectors. Accordingly, the volume of space occupied by the inter-board connectors to achieve interconnection is reduced by blindly joining connectors with ultra-small board spacing, and the number of components included in the connectors is also reduced. Thus, the number of assembly procedures can be reduced, which facilitates automated assembly production.

As described in this disclosure, the term "one" is not for limiting the number of relevant parts of the present disclosure to "only one", and "one" does not exclude situations where the number of relevant parts of the present disclosure is "more than one".

Unless otherwise stated, the numerical range described in this disclosure includes not only the entire range within its two endpoints, but also several subranges contained therein.

While the present disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:

1. A test adapter for establishing a test connection with a circuit board, wherein the circuit board comprises a floating inter-board connector or a planar contact in contact with the floating inter-board connector,
    the test adapter comprising:
    a metal housing comprising a contact surface in contact with a flat surface of the circuit board, a connection end opposite to the contact surface, and a first cavity having a first opening at the center of the contact surface;
    a first outer conductor and a first inner conductor arranged in the first cavity;
    an insulating medium arranged between the first outer conductor and the first inner conductor; and
    at least one mounting hole for fixing the test adapter to the circuit board, and wherein the at least one mounting hole is formed on the contact surface,
    wherein an end of the first outer conductor and an end of the first inner conductor protrude out of the housing via the first opening,
    wherein the first outer conductor and the first inner conductor both have an elastic deformation capacity along an axial direction to enable the end of the first outer conductor and the end of the first inner conductor both to retract inwards to be in close contact with the planar contact to form a signal-conductive connection between the planar contact and the connection end when the contact surface is in contact with the circuit board,
    wherein the first opening further comprises a sink recessed inside the metal housing to form a first step surface with an inner wall of the first cavity,
    wherein the insulating medium is recessed in the first cavity, and
    wherein an end surface of the insulating medium is flush with the first step surface.

2. The test adapter according to claim 1, wherein the planar contact comprises:
    a center contact, arranged at the center of the planar contact; and a ring-shaped contact, arranged to surround the center contact concentrically with the center contact, and insulated from the center contact by an insulating material, wherein the first outer conductor is electrically connected to the ring-shaped contact, and the first inner conductor forms a signal-conductive connection with the center contact.

3. The test adapter according to claim 2, wherein the first outer conductor comprises:

a first tube wall that is a circular tube arranged in contact with the inner wall of the first cavity; and a first reed extending along a radial direction out of the first tube wall via an end of the first tube wall facing the first opening, wherein the first reed and the first tube wall form a first angle.

4. The test adapter according to claim 3, wherein the first reed has a first contact end surface perpendicular to the first tube wall, and wherein the first contact end face protrudes out of the housing via the first opening to be electrically connected to the ring-shaped contact.

5. The test adapter according to claim 4, wherein the first opening has a diameter larger than an outer diameter of the first reed.

6. The test adapter according to claim 5, wherein the first outer conductor comprises:

a first inner conductor housing arranged in the insulating medium along an axial direction, and an end of the first inner conductor housing opposite to the first opening forms a signal-conductive connection with the connection end; and a first elastic contact, arranged at an end of the first inner conductor housing facing the first opening and capable of elastically expanding and contracting along the first inner conductor housing, wherein an end surface of the first inner conductor housing facing the first opening is flush with the first step surface, and the first elastic contact extends out of the housing via the first opening to form a signal-conductive connection with the center contact.

7. The test adapter according to claim 3, wherein the first cavity further comprises a second step surface with a reduced diameter, and wherein the second step surface supports an end of the first tube wall opposite to the first opening.

* * * * *